United States Patent [19]

Subramanian et al.

[11] Patent Number: 5,668,021
[45] Date of Patent: Sep. 16, 1997

[54] PROCESS FOR FABRICATING A SEMICONDUCTOR DEVICE HAVING A SEGMENTED CHANNEL REGION

[75] Inventors: Chitra K. Subramanian; James D. Hayden, both of Austin, Tex.

[73] Assignee: Motorola, Inc., Schaumburg, Ill.

[21] Appl. No.: 658,972

[22] Filed: Jun. 4, 1996

[51] Int. Cl.⁶ .................................................. H01L 21/266
[52] U.S. Cl. ...................... 438/282; 438/526; 438/532; 438/595
[58] Field of Search ...................... 437/26, 44, 45, 437/984

[56] References Cited

U.S. PATENT DOCUMENTS

| | | | |
|---|---|---|---|
| 4,371,955 | 2/1983 | Sasaki | 365/185 |
| 5,374,574 | 12/1994 | Kwon | 437/45 |
| 5,484,743 | 1/1996 | Ko et al. | 437/44 |
| 5,489,543 | 2/1996 | Hong | 437/26 |
| 5,538,913 | 7/1996 | Hong | 437/44 |
| 5,597,752 | 1/1997 | Niwa | 437/44 |

FOREIGN PATENT DOCUMENTS 5-55564  3/1993  Japan .......................... H01L 29/784

*Primary Examiner*—Chandra Chaudhari

[57] ABSTRACT

A process for fabricating an MOS device (44) having a segmented channel region (48) includes the fabrication of a compound MOS gate electrode (46). Both the segmented channel region (48) and the MOS gate electrode (46) are formed by creating an opening (18) and an insulating layer (16) overlying a first polycrystalline silicon layer (14). The lateral extent of both the MOS gate electrode (46) and a buried junction region (24) formed in the semiconductor substrate (10) are defined by first sidewall spacer (22) and a second sidewall spacer (32) formed adjacent to the first sidewall spacer (22).

11 Claims, 2 Drawing Sheets

PROCESS FOR FABRICATING A SEMICONDUCTOR DEVICE HAVING A SEGMENTED CHANNEL REGION

RELATED APPLICATION

Related subject matter is disclosed in co-pending, commonly assigned patent application having Ser. No. 08/395,339 now U.S. Pat. No. 5,605,855 and filed Feb. 28, 1995.

1. Field of the Invention

This invention relates, in general, to a method for fabricating a semiconductor device, and more particularly, to a method of fabricating an MOS device having both surface channel and buried channel characteristics.

2. Background of the Invention

As individual transistors within integrated circuits are scaled to smaller and smaller dimensions engineering refinements in transistor design are necessary to maintain optimum device performance. The optimum performance must be achieved while avoiding performance degradation arising from hot carrier injection, drain leakage, punch-through, and the like. In metal-oxide-semiconductor (MOS) devices having channel lengths in the submicron range, the channel region must be carefully designed to maximize current drive and overall circuit performance, and to minimize short channel effects.

Buried channel devices have high carrier mobility and correspondingly high drive current because of the relatively low electric field in the channel region. The electric field in the channel region of the buried channel device is reduced by a buried junction region within the channel region. Although buried channel devices have high current mobility, short channel effects are aggravated by large depletion regions in a buried channel device. In contrast, surface channel devices are more resistant to short channel effects than are buried channel devices of similar dimensions. Also, surface channel devices are more resistant to drain induced barrier lowering and to electrical punch-through than are buried channel devices. However, surface channel devices have small depletion regions causing relatively high electric fields. The high electric field results in lower transconductance and lower drive current.

From the foregoing discussion it is apparent that both surface channel devices and buried channel devices offer performance related advantages and disadvantages. Despite the short channel effect problems, a desire to obtain the high drive current offered by buried channel devices continues to motivate design interest in buried channel devices for submicron MOS devices.

Recent development effort in submicron device design has been directed toward engineering the doping profiles within the channel region itself. MOS devices having a non-uniformly doped channel can be obtained by providing precisely tailored doping concentration gradients within the channel region of the transistor. Proper doping of the channel region can lead to the formation of a device having both surface channel and buried channel characteristics. However, formation of symmetrical doped regions within the channel region requires that they be precisely defined within the channel region to avoid any asymmetry in the doping concentration profile within the channel region. Channel doping techniques which rely on the critical alignment of photolithographic layers can result in asymmetrical doping profiles if the lithographic alignment does not meet required alignment tolerances. Accordingly, further process development is necessary to provide an MOS device having non-uniform channel doping that can be reliably manufactured, and to provide completely symmetrical doping profiles in submicron transistors.

SUMMARY OF THE INVENTION

In practicing the present invention there is provided a process for fabricating a semiconductor device having a segmented channel region. The channel region fabricated in accordance with the invention contains both surface channel regions and a buried junction region. Thus, the MOS device fabricated in accordance with the invention combines the advantages of both surface channel devices and buried channel devices. The device provides high transconductance and carrier mobility, while maintaining substantial immunity to short channel effects. In one embodiment of the invention, a semiconductor substrate is provided having a first polycrystalline silicon layer overlying the substrate and separated therefrom by a dielectric layer. An insulating layer is formed to overlie the first polycrystalline silicon layer, and an opening in the insulating layer is formed to define a gate region. A first sidewall spacer is formed in the opening and a buried junction region is formed in the substrate using the first sidewall spacer as a doping mask. The opening is then filled with a second polycrystalline silicon layer and the insulating layer is removed. A second sidewall spacer is formed adjacent to the gate region and to the first sidewall spacer. Finally, source and drain regions are formed in the substrate using the second sidewall spacer as a doping mask.

Figure 1:
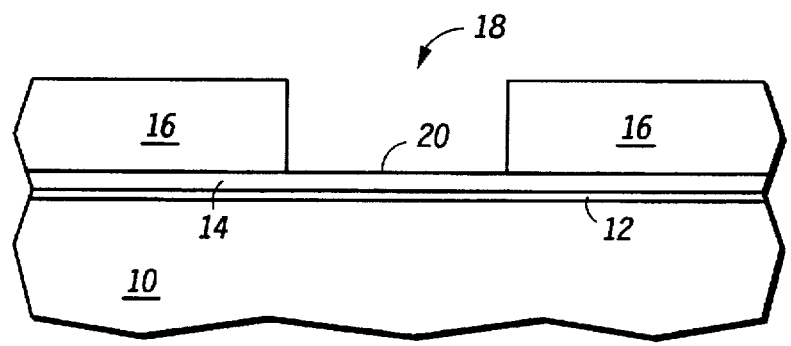
FIGS. 1–7 illustrate, in cross-section, process steps in accordance with the invention.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DETAILED DESCRIPTION OF PREFERRED EMBODIMENTS

The present invention is for a process for fabricating an MOS device having a segmented channel region. The MOS device contains a buried junction region in a central portion of the electrically conductive channel of the device. Surface channel regions reside near the source and drain electrodes of the MOS device. By incorporating both a buried junction and surface channel regions within the electrically conductive channel, the transconductance and the carrier mobility through the central portion of the channel is high. The low electric field created by the buried junction and the high transconductance leads to higher drive current in the MOS device fabricated in accordance with the invention. In addition, the MOS device fabricated in accordance with the invention exhibits immunity to short channel effects. Since the regions near the source and drain electrodes, which are most vulnerable to short channel effects, operate similar to a surface channel device, large changes in electric fields can be effectively controlled with minimal reduction in overall performance. The segmented channel region of the MOS device fabricated in accordance with the invention provides improved performance and can be easily integrated into a wide variety of integrated circuit designs.

FIG. 1 illustrates, in cross-section, a portion of a semiconductor substrate 10 having already undergone several processing steps in accordance with one embodiment of the invention. A dielectric layer 12 overlies the surface of a semiconductor substrate 10 and separates a first polycrystalline silicon layer 14 from semiconductor substrate 10. Preferably, first polycrystalline silicon layer 14 is deposited by chemical vapor deposition to a thickness of about 200 to 400 angstroms, and most preferably to about 300 angstroms. Dielectric layer 12 is preferably silicon dioxide thermally grown on the surface of semiconductor substrate 10 to a thickness of about 50 to 100 angstroms.

An insulating layer 16 overlies first polycrystalline silicon layer 14. Insulating layer 16 contains an opening 18 exposing a gate portion 20 of first polycrystalline silicon layer 14. Insulating layer 16 is preferably silicon dioxide deposited by chemical vapor deposition using tetraethylorthosilane (TEOS) source gas.

Opening 18 is preferably performed by a photolithographic masking step (not shown) followed by a reactive ion etching step to anisotropically etch insulating layer 16. Opening 18 defines a region on semiconductor substrate 10 where an MOS gate electrode will be formed. The physical dimensions of opening 18 will define the lateral extent of the gate electrode on semiconductor substrate 10. Additionally, the deposited thickness of insulating layer 16 will determine, in part, the vertical dimensions of the gate electrode. Accordingly, the thickness of insulating layer 16 and the dimensions of the photolithographic mask used to form opening 18 are determined depending upon the desired physical dimensions of the MOS gate electrode. In one embodiment, insulating layer 16 is deposited to a thickness of about 1000 to 3000 angstroms, and opening 18 is patterned and etched to have a width of about 0.2 to 1.0 microns.

Figure 2:
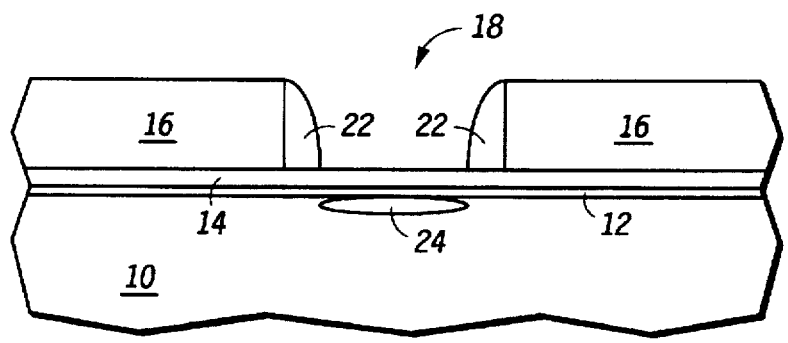

The process of the invention continues, as illustrated in FIG. 2, with the formation of a first sidewall spacer 22. Preferably, first sidewall spacer 22 is formed by the chemical vapor deposition of a layer of silicon nitride, followed by anisotropic etching to form the spacer. Once first sidewall spacer 22 is formed, a doping process is carried out to form a buried junction region 24 in semiconductor substrate 10, using first sidewall spacer 22 as a doping mask.

The dimensions of buried junction region 24 are important in determining the electrical characteristics of the MOS device. In the process of the present invention, first sidewall spacer 22 is used to define the lateral extent of buried junction region 24 in semiconductor substrate 10. The deposited thickness of the material used to form first sidewall spacer 22 will determine the width of first sidewall spacer 22. In a preferred embodiment, silicon nitride is deposited to a thickness of about 300 to 1000 angstroms.

Preferably, buried junction region 24 is formed by ion implantation of a dopant species into semiconductor substrate 10. The implanted dopant species penetrates through the gate portion of first polycrystalline silicon layer 20 and dielectric layer 12 and into semiconductor substrate 10. In order for the MOS device to have the segmented channel characteristics previously described, buried junction region 24 is formed to have a conductivity type opposite of that of semiconductor substrate 10. For example, where semiconductor substrate 10 is a P-type substrate, buried junction region 24 will be formed by the implantation of an N-type dopant species, such as arsenic or phosphorous, or the like. Conversely, in the case of an N-type substrate, preferably boron ions are implanted at an energy sufficient to penetrate first polycrystalline silicon layer 14 and gate dielectric layer 12. The peak dopant concentration of buried junction region 24 is placed just below the surface of semiconductor substrate 10.

Figure 3:
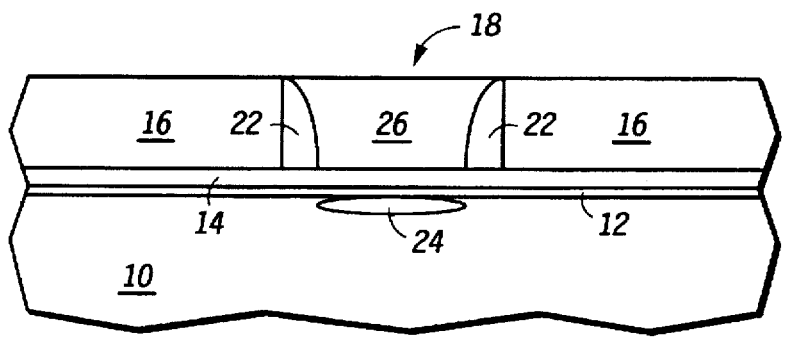

After forming buried junction region 24, a second polycrystalline silicon layer is deposited to overlie insulating layer 16 and gate region 20 of first polycrystalline silicon layer 14. Then, a planarization process is carried out to form a polycrystalline silicon body 26, as illustrated in FIG. 3. The planarization process creates polycrystalline silicon body 26 within opening 18 as defined by sidewall spacer 22. Preferably, a chemical-mechanical-polishing (CMP) process is used to planarize the second polycrystalline silicon layer. Although CMP is the preferred planarization process, other planarization processes, such as an etch-back process can also be used to form polycrystalline silicon body 26. Preferably, the second polycrystalline silicon layer is deposited by chemical vapor deposition and is either doped with a conductivity determining dopant during the chemical vapor deposition process, or immediately afterward. In an alternative embodiment, polycrystalline silicon body 26 can be formed by the selective deposition of silicon using first polycrystalline silicon layer 14 as a nucleation site. The selective deposition process deposits successive layers of silicon onto the nucleation site eventually filling opening 18.

It is important to note that in order for the MOS device under construction to operate with the aforementioned advantages of a segmented channel region, the MOS gate electrode must have a conductivity type similar to that of buried junction region 24. Accordingly, in the case of an N-type device, polycrystalline silicon body 26 is fabricated to have an N-type conductivity. Either during the chemical vapor deposition process, or immediately afterwards, an N-type dopant, such as phosphorous or arsenic, or the like, is introduced to impart an N-type conductivity to polycrystalline silicon body 26. Those skilled in the art will recognize that although the process of the present invention is described in the context of the fabrication of an N-type MOS transistor, the dopant type of the substrate with respect to the doped regions and the MOS gate electrode can be reversed and a P-type MOS device can be formed. Additionally, both N-type and P-type devices can be formed on the same substrate as part of a CMOS process.

Figure 4:
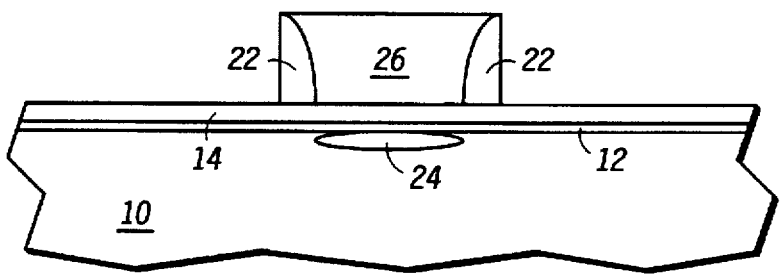

Once polycrystalline silicon body 26 is formed, insulating layer 16 is removed as illustrated in FIG. 4. Preferably, an etching process is used to remove insulating layer 16, such that sidewall spacer 22 and the exposed polycrystalline silicon material are not etched. A selective etching process is used that removes silicon dioxide much more rapidly than silicon nitride or polycrystalline silicon. In one embodiment, a chlorine containing liquid etching bath is used to remove insulating layer 16. The removal of insulating layer 16 exposes portions of first polycrystalline silicon layer 14 that is not covered by polycrystalline silicon body 26 or by first sidewall spacer 22.

Figure 5:
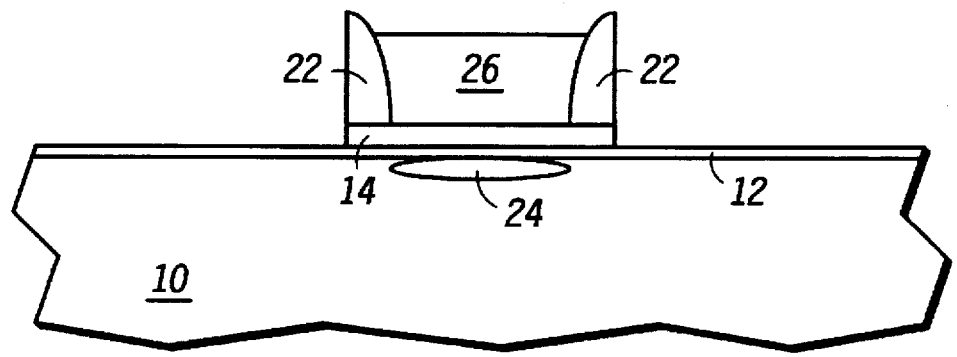

Next, an etching process is carried out to remove the exposed portions of first polycrystalline silicon layer 14. The etching process utilizes polycrystalline silicon body 26 and sidewall spacer 22 as an etching mask. During the etching process, a portion of polycrystalline silicon body 26 is removed, as illustrated in FIG. 5. The etching process, however, is selective to dielectric materials, such as silicon dioxide and silicon nitride, so that dielectric layer 12 and first sidewall spacer 22 are not appreciably etched. It is important to note that first polycrystalline silicon layer 14 is deposited to a thickness of only about 200 to 400 angstroms. The thickness of first polycrystalline silicon layer 14 is substantially less than the thickness of polycrystalline silicon body 26. As a result of the thickness differential only a small amount of the total thickness of polycrystalline silicon body 26 is removed during the polycrystalline silicon etching process.

Figure 6:
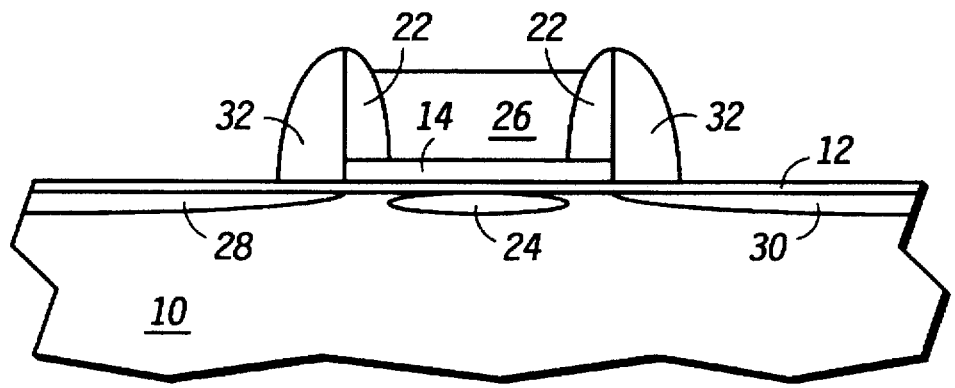

After etching away exposed portions of first polycrystalline silicon layer 14, an optional doping process can be carried out to form lightly doped source and drain regions 28 and 30, respectively. Once the lightly doped source and drain regions are formed, a second sidewall spacer 32 is formed as illustrated in FIG. 6. Preferably, second sidewall spacer 32 is fabricated by first chemical vapor depositing of a layer of silicon dioxide using TEOS source gas, then by anisotropically etching the silicon dioxide layer. Second sidewall spacer 32 protects portions of semiconductor substrate 10 adjacent to first sidewall spacer 22.

As shown in FIG. 6, a small portion of semiconductor substrate 10 underlying first sidewall spacer 22 does not contain dopants from either buried junction region 24 or lightly doped source and drain regions 28 and 30. These small regions of semiconductor substrate 10 will be protected from the aforementioned doping processes regardless of whether or not lightly doped source and drain regions 28 and 30 are formed. Proper functioning of the segmented channel region of the MOS device under fabrication requires that the small portions of semiconductor substrate 10 adjacent to either side of buried junction region 24 contain a precisely controlled dopant concentration. Further, the dopants must be of a conductivity type identical to that of substrate 10.

Figure 7:
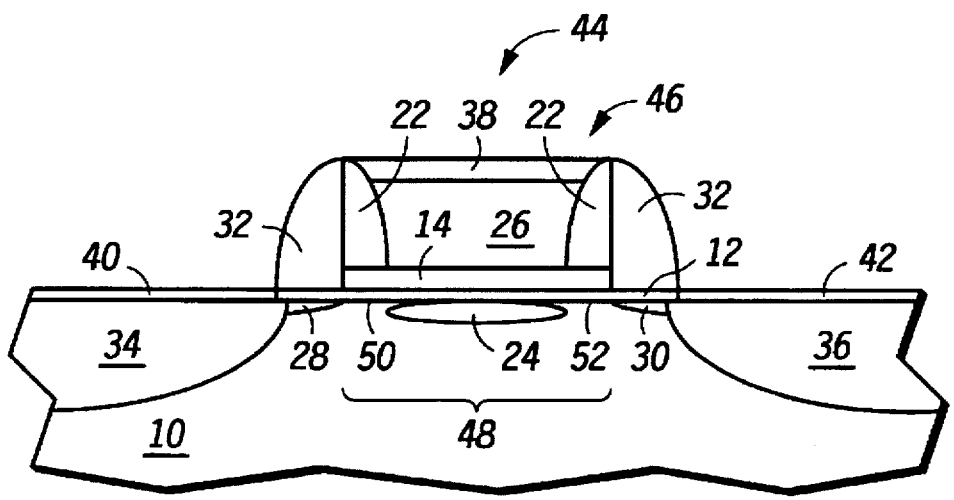

In accordance with the invention, the fabrication of the MOS device is completed as illustrated in FIG. 7. Heavily doped source and drain regions 34 and 36 are formed using second sidewall spacer 32 as a doping mask. Once heavily doped source and drain regions 34 and 36 have been formed, portions of dielectric layer 12 overlying the surface of semiconductor substrate 10 are etched away using sidewall spacers 32 as an etching mask. Although, in one embodiment of the invention, dielectric layer 12 and second sidewall spacer 32 are both silicon dioxide, dielectric layer 12 is a thermally grown dielectric material having a thickness far less than that of second sidewall spacer 32. As a result of the thickness differential, very little of sidewall spacer 32 is removed during the oxide etching process.

After removing the exposed portions of dielectric layer 12, refractory metal silicide regions are formed overlying polycrystalline silicon body 26 and heavily doped source and drain regions 34 and 36. Heavily doped source and drain regions 34 and 36 are preferably formed by ion implantation of an N-type dopant, such as arsenic or phosphorous, or the like, using sidewall spacer 32 as a doping mask. Preferably, silicide regions 38, 40 and 42 are fabricated by the deposition of a refractory metal such as titanium, tantalum, tungsten, cobalt, and the like, followed by an annealing step to form a refractory metal silicide. During the annealing process, a reaction takes place between silicon and semiconductor substrate 10 and first polycrystalline silicon body 26 to form the refractory metal silicide. A silicide is not formed in regions where the refractory metal overlies a dielectric material, such as second sidewall spacer 32.

Upon completion of the fabrication process of the invention a fully functional, segmented MOS device 44 is formed having an compound MOS gate electrode 46. MOS gate electrode 46 includes first polycrystalline silicon layer 14, polycrystalline silicon body 26, and refractory metal silicide region 38. MOS gate electrode 46 overlies a segmented channel region 48. The channel region includes a central buried junction region 24 and surface channel regions 50 and 52 on either side of buried junction region 24. Surface channel regions 50 and 52 separate lightly doped regions 28 and 30, respectively, from buried junction region 24.

In operation, majority carriers traverse segmented channel region 48 from heavily doped source region 34 to heavily doped drain region 36. The majority carrier pathway is created in segmented channel region 28 by fabricating the source and drain regions, the MOS gate electrode, and the buried junction region to have the same conductivity type. In contrast, semiconductor substrate 10 and surface channel regions 50 and 52 have a conductivity type opposite to that of the source drain regions, the MOS gate electrode, and to the buried junction region.

Thus it is apparent that there has been provided, in accordance with the invention, a process for fabricating a semiconductor device having a segmented channel region, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, different process techniques can be used, such as molecular beam deposition, deep UV and X-ray lithography, and the like, in the device fabrication process. It is therefore intended to include within the invention all such variations and modifications as fall within the scope of the appended claims and equivalents thereof.

We claim:

1. A process for fabricating a semiconductor device comprising the steps of:

providing a semiconductor substrate having a dielectric layer thereon;

forming a first polycrystalline silicon layer overlying the dielectric layer;

forming an insulating layer overlying a first portion and a second portion of the first polycrystalline silicon layer;

forming an opening in the insulating layer exposing the first portion of the first polycrystalline silicon layer, the opening having a wall surface;

forming a first sidewall spacer adjacent to the wall surface;

forming a buried junction region in the semiconductor substrate aligned to the first sidewall spacer;

filling the opening with a second polycrystalline silicon layer;

removing the insulating layer and the second portion of the first polycrystalline silicon layer;

forming a second sidewall spacer adjacent to the first sidewall spacer and overlying the dielectric layer; and forming source and drain regions in the semiconductor substrate.

2. The process of claim 1, further comprising the step of forming a silicide layer overlying the second polycrystalline silicon layer.

3. The process of claim 1, further comprising the step of doping the semiconductor substrate to form a surface channel region prior to the step of forming the insulating layer.

4. The process of claim 1, further comprising the step of forming lightly doped regions in the semiconductor substrate after removing the second portion of the first polycrystalline silicon layer.

5. The process of claim 1, wherein the step of providing a semiconductor substrate comprises the step of providing a semiconductor substrate of a first conductivity type, and wherein the steps of forming a buried junction region and forming source and drain regions comprise implanting dopants of a second conductivity type.

6. A process for fabricating a semiconductor device comprising the steps of:

providing a semiconductor substrate having a first polycrystalline silicon layer overlying the semiconductor substrate and separated therefrom by a dielectric layer;

forming an insulating layer overlying the first polycrystalline silicon layer;

forming an opening in the insulating layer to define a gate region in the first polycrystalline silicon layer and leaving a remaining portion of the first polycrystalline silicon layer covered by the insulating layer, the opening having a wall surface;

forming a first sidewall spacer in the opening adjacent to the wall surface;

implanting dopants into the semiconductor substrate to form a buried junction region in the semiconductor substrate using the first sidewall spacer as a doping mask;

filling the opening with a second polycrystalline silicon layer;

removing the insulating layer and the remaining portion of the first polycrystalline silicon layer;

forming a second sidewall spacer adjacent to the gate region and to the first sidewall spacer; and forming source and drain regions in the semiconductor substrate.

7. The process of claim 6, wherein the step of providing a semiconductor substrate comprises the step of providing a semiconductor substrate of a first conductivity type, and wherein the step of implanting dopants comprises implanting dopants of a second conductivity type.

8. The process of claim 6, further comprising the step of forming a silicide layer overlying the second polycrystalline silicon layer.

9. The process of claim 6, wherein the step of forming a first sidewall spacer comprises the steps of depositing a layer of silicon nitride and anisotropically etching the layer of silicon nitride.

10. The process of claim 6, further comprising the step of doping the semiconductor substrate to form a surface channel region prior to the step of forming the insulating layer.

11. A process for fabricating a semiconductor device comprising the steps of:

providing a semiconductor substrate of a first conductivity type having a first polycrystalline silicon layer overlying the semiconductor substrate and separated therefrom by a dielectric layer;

implanting the semiconductor substrate to form a surface channel region of the first conductivity type therein;

forming an insulating layer overlying the first polycrystalline silicon layer;

forming an opening in the insulating layer to define a gate region in the first polycrystalline silicon layer and leaving a remaining portion of the first polycrystalline silicon layer covered by the insulating layer, the opening having a wall surface;

forming a first sidewall spacer in the opening adjacent to the wall surface;

implanting dopants of a second conductivity type into the substrate to form a buried junction region in the substrate using the first sidewall spacer as a doping mask;

filling the opening with a second polycrystalline silicon layer of the second conductivity type;

filling the opening with a second polycrystalline silicon layer;

removing the insulating layer and the remaining portion of the first polycrystalline silicon layer;

forming a second sidewall spacer adjacent to the gate region and to the first sidewall spacer; and implanting dopants of the second conductivity type into the semiconductor substrate to form source and drain regions using the second sidewall spacer as a doping mask.

* * * * *